United States Patent
Hashimoto

(10) Patent No.: US 9,679,662 B1
(45) Date of Patent: Jun. 13, 2017

(54) MEMORY DEVICE

(71) Applicant: KABUSHIKI KAISHA TOSHIBA, Tokyo (JP)

(72) Inventor: Toshifumi Hashimoto, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/233,442

(22) Filed: Aug. 10, 2016

(30) Foreign Application Priority Data

Feb. 1, 2016 (JP) ................................ 2016-017377

(51) Int. Cl.

| | | |
|---|---|---|
| *G11C 16/26* | (2006.01) | |
| *G11C 16/08* | (2006.01) | |
| *H01L 27/1157* | (2017.01) | |
| *H01L 27/11582* | (2017.01) | |
| *H01L 27/11573* | (2017.01) | |
| *H01L 23/528* | (2006.01) | |
| *H01L 23/522* | (2006.01) | |

(52) U.S. Cl.
CPC .............. *G11C 16/26* (2013.01); *G11C 16/08* (2013.01); *H01L 23/528* (2013.01); *H01L 23/5226* (2013.01); *H01L 27/1157* (2013.01); *H01L 27/11573* (2013.01); *H01L 27/11582* (2013.01)

(58) Field of Classification Search
CPC ..... G11C 16/26; G11C 16/08; G11C 16/0483; H01L 23/5226; H01L 23/528; H01L 27/1157; H01L 27/11573; H01L 27/11582
USPC .............. 365/185.18, 185.05, 185.11, 185.17
See application file for complete search history.

(56) References Cited

U.S. PATENT DOCUMENTS

| | | | |
|---|---|---|---|
| 7,936,004 B2 | 5/2011 | Kito et al. | |
| 8,374,033 B2* | 2/2013 | Kito | G11C 16/0483 365/185.05 |
| 2012/0120728 A1* | 5/2012 | Kim | G11C 5/063 365/185.18 |
| 2014/0355351 A1* | 12/2014 | Unno | G11C 16/24 365/185.17 |
| 2014/0369127 A1* | 12/2014 | Hara | G11C 16/0408 365/185.17 |
| 2015/0325303 A1 | 11/2015 | Hashimoto et al. | |
| 2016/0071593 A1 | 3/2016 | Hashimoto | |

(Continued)

FOREIGN PATENT DOCUMENTS

JP 2007-266143 A 10/2007

*Primary Examiner* — Tan T. Nguyen
(74) *Attorney, Agent, or Firm* — Patterson & Sheridan, LLP

(57) ABSTRACT

A memory device includes a semiconductor pillar, a first memory cell that includes a first memory film between a first word line and a side surface of the semiconductor pillar, a second memory cell that includes a second memory film between a second word line and the side surface of the semiconductor pillar, and a control circuit configured to carry out first and second operations on the first memory cell and the second memory cell during a reading operation. During the first operation, a read voltage is applied to the first word line and a read pass voltage is applied to the second word line, and during the second operation following the first operation, a first voltage is applied to the second word line, such that a potential of the second word line is lower than a potential of the semiconductor pillar.

20 Claims, 13 Drawing Sheets

(56) References Cited

U.S. PATENT DOCUMENTS

2016/0118122 A1\* 4/2016 Hwang ............ H01L 27/11551
  365/185.17
2016/0267991 A1 9/2016 Hashimoto et al.

\* cited by examiner

MEMORY DEVICE

CROSS-REFERENCE TO RELATED APPLICATION

This application is based upon and claims the benefit of priority from Japanese Patent Application No. 2016-017377, filed Feb. 1, 2016, the entire contents of which are incorporated herein by reference.

FIELD

Embodiments described herein relate generally to a memory device.

BACKGROUND

A NAND flash memory in which memory cells are arranged in three dimensions is known.

DETAILED DESCRIPTION

Figure 1:
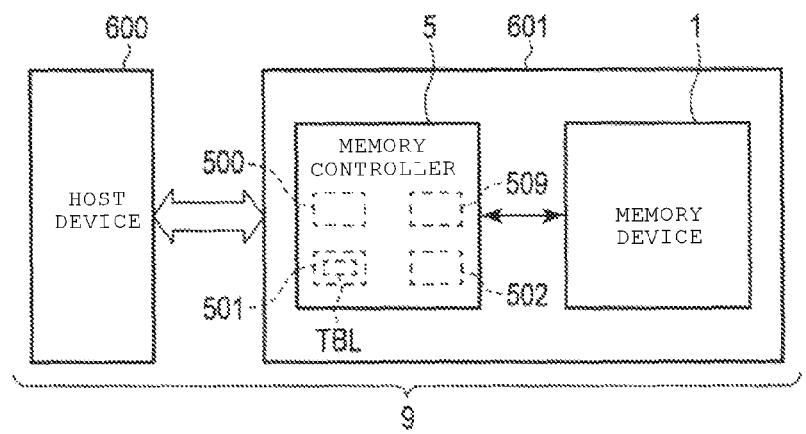
FIG. 1 is a block diagram illustrating a memory system including a memory device according to an embodiment.

In general, according to an embodiment, a memory device includes a semiconductor pillar, a first memory cell that includes a first memory film between a first word line and a side surface of the semiconductor pillar, a second memory cell that includes a second memory film between a second word line and the side surface of the semiconductor pillar, and a control circuit configured to carry out first and second operations on the first cell and the second memory cell during a reading operation. During the first operation, a read voltage is applied to the first word line and a read pass voltage is applied to the second word line, and during the second operation following the first operation, a first voltage is applied to the second word line, such that a potential of the second word line is lower than a potential of the semiconductor pillar.

Hereinafter, embodiments will be described with reference to the drawings. In the following description, common reference numerals are given to elements having the same function and configuration.

In addition, in the following each embodiment, in a case where reference numerals (for example, a word line WL, a bit line BL, various voltages and signals, and the like) are not distinguished from each other using trailing number/English letters, such items are described employing the reference numerals and without the trailing numbers/English letters.

Embodiment

A memory device according to embodiments will be described with reference to FIGS. 1 to 14.

(1) First Embodiment (a) Configuration

A configuration example of the memory device according to the embodiment will be described with reference to FIGS. 1 to 7B.

As illustrated in FIG. 1, a memory system 9 including a memory device according to the embodiment has a storage device 601 and a host device 600.

The host device 600 is, for example, coupled to the storage device 601 by a connector, a cable, wireless communication, an intranet, the Internet, and the like.

The host device 600 requests writing/erasing of data and reading of the data to the storage device 601. The storage device 601 is operated in response to a request from the host device 600.

The storage device 601 includes a memory controller 5 and a memory device (e.g., semiconductor memory or flash memory) 1. The memory controller 5 causes the memory device 1 to execute an operation in response to the request of the host device 600.

The memory controller 5 includes a processor (CPU) 500, a DRAM 501, a SRAM 502, an ECC circuit 509, and the like. The CPU 500 controls the operation of the memory controller 5. The DRAM 501 temporarily stores programs (software or firmware) and management information (e.g., management table). The SRAM 502 temporarily stores data. The ECC circuit 509 adds parity to data to be written during writing of the data to the memory device 1. The ECC circuit 509 detects errors in the data read from the memory device 1 and corrects the detected errors based on the parity or a syndrome generated from the parity during reading of the data from the memory device 1.

The memory device 1 stores the data. The memory device 1 executes writing of the data and reading of the data based on an instruction (which is generated, e.g., in response to a request of the host device 600) from the memory controller 5.

The memory device 1 is, for example, a NAND type flash memory. For example, the storage device 601 (or the memory system 9) including the flash memory 1 is a memory card (for example, a SD™ card and an eMMC™), a USB memory, a Solid State Drive (SSD), or the like.

Figure 2:
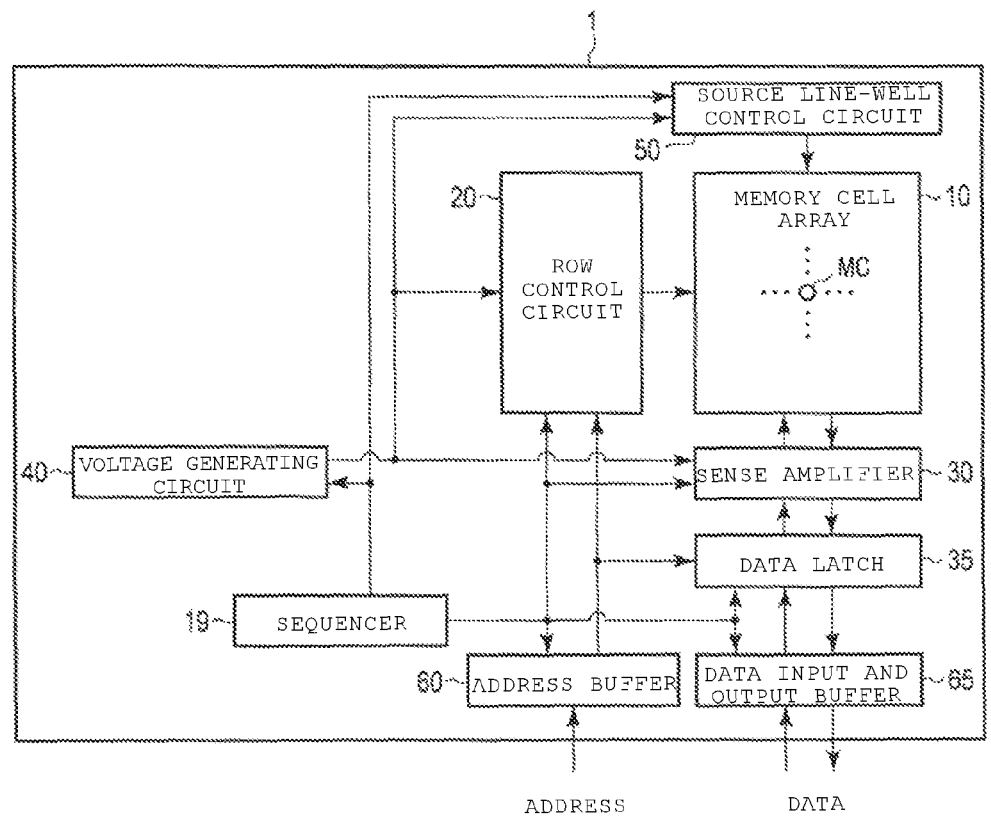
FIG. 2 is a block diagram illustrating an example of an internal configuration of the memory device according to the embodiment.

As illustrated in FIG. 2, the NAND type flash memory 1 includes a memory cell array 10, a row control circuit 20, a sense amplifier circuit 30, a data latch circuit 35, a voltage generating circuit 40, a source line-well control circuit 50, an address buffer 60, a data input and output buffer 65, a sequencer 19, and the like.

The memory cell array 10 includes a plurality of memory cells MC. One memory cell MC can store data of one or more bits.

The row control circuit 20 controls rows (for example, word lines) of the memory cell array 10.

The sense amplifier circuit 30 senses and amplifies a signal output to a bit line in the memory cell array 10 during reading of the data. For example, the sense amplifier circuit 30 senses generation of a current in the bit line or a change in a potential of the bit line as a signal from the memory cell MC. In that manner, the sense amplifier circuit 30 reads data stored in the memory cell MC. In addition, the sense amplifier circuit 30 controls the potential of the bit line in response to writing data during writing of the data.

The data latch circuit (page buffer circuit) 35 temporarily stores data output from the memory cell array 10 and data input into the memory cell array 10.

The voltage generating circuit 40 generates various voltages used in an operation of the memory cell array 10. The voltage generating circuit 40 outputs the various generated voltages to each circuit.

The source line-well control circuit 50 controls a potential of a source line in the memory cell array 10. The source line-well control circuit 50 controls a potential of a well region in the memory cell array 10.

The address buffer 60 temporarily stores an address ADR from the memory controller 5. The address buffer 60 supplies the address ADR to the row control circuit 20 and the data latch circuit 35.

The data input and output buffer 65 temporarily stores data from the memory controller 5 and data from the data latch circuit 35.

The sequencer 19 controls the operation of the flash memory 1. The sequencer 19 controls an internal operation of the flash memory 1 based on a control signal and a command that are transmitted and received between the flash memory 1 and the memory controller 5.

Configuration of Three Dimensional Structure Memory Cell Array

An example of an internal configuration of a memory cell array in the flash memory according to the embodiment will be described with reference to FIGS. 3 to 6.

The flash memory 1 according to the embodiment includes the memory cell array 10 having a three dimensional structure.

Figure 3:
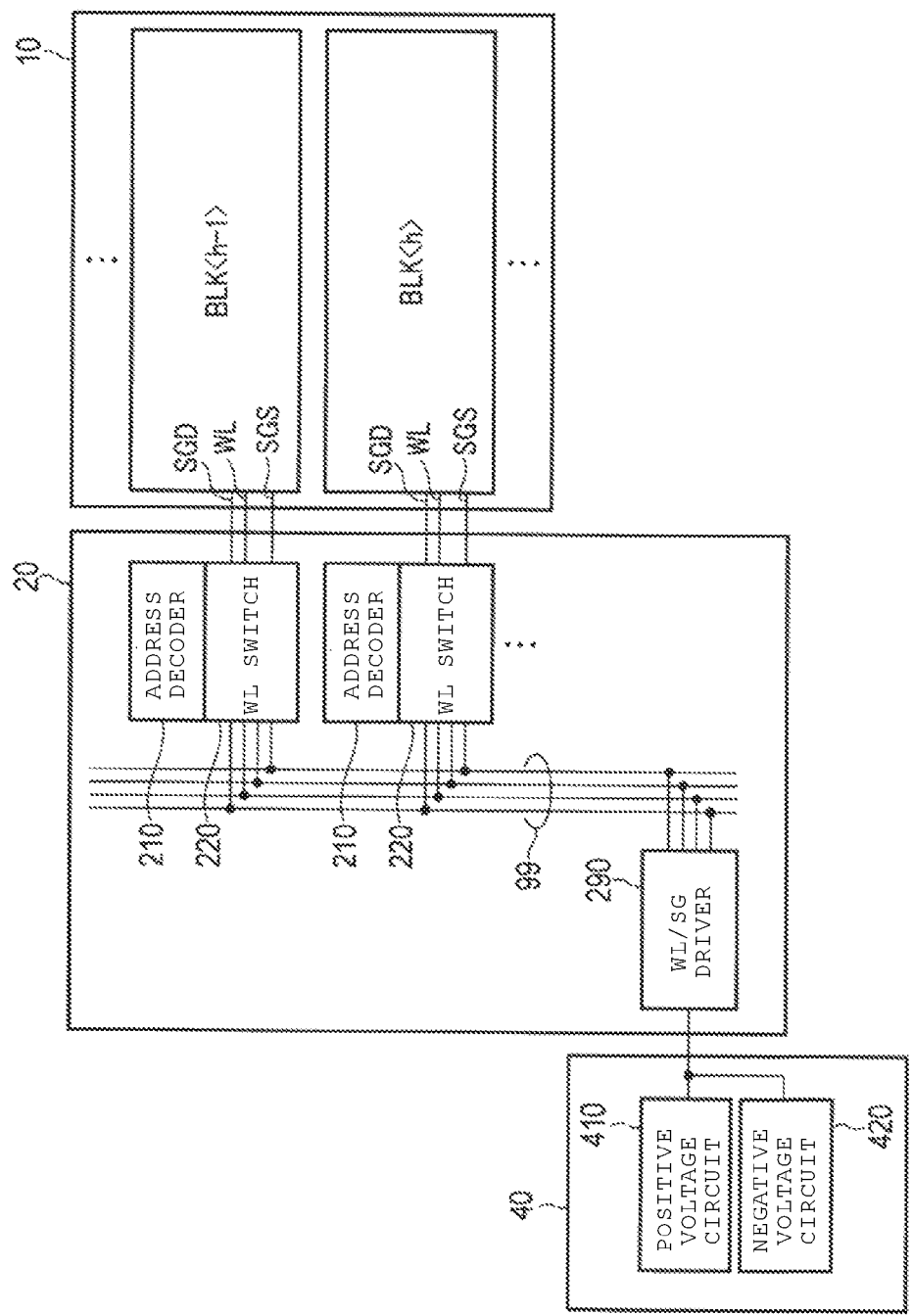
FIG. 3 is a block diagram illustrating an example of the internal configuration of several components of the memory device according to the embodiment.

As illustrated in FIG. 3, the memory cell array 10 includes one or more blocks BLK (BLK<h-1> and BLK<h>). Symbol h represents a natural number of 1 or more.

In the flash memory, the block BLK is an erasing unit of data. However, an erasing operation for the memory cell array 10 may be executed for a unit (storage region) smaller than the block. The erasing operation of the flash memory is described, e.g., in "NONVOLATILE SEMICONDUCTOR STORAGE APPARATUS AND MANUFACTURING METHOD THEREOF" of U.S. patent application Ser. No. 12/679,991, filed on Mar. 25, 2010, and in "SEMICONDUCTOR MEMORY AND MANUFACTURING METHOD THEREOF" of U.S. patent application Ser. No. 12/532,030, filed on Mar. 23, 2009, both of which are incorporated by reference herein in their entirety.

The row control circuit 20 includes a plurality of address decoders 210, a plurality of switch circuits 220, and a word line and select gate line driver 290.

The address decoders 210 are each provided for one of the blocks BLK on a one-to-one basis.

The address decoder 210 decodes the address ADR from the memory controller 5. The address decoder 210 supplies a decoded result to the switch circuit 220.

The switch circuits 220 are each provided for one of the address decoders 210 on a one-to-one basis. The switch circuits 220 are each provided for one of the blocks BLK on a one-to-one basis. The plurality of switch circuits 220 are connected to a common wiring group 99.

The switch circuit 220 selects the block BLK indicated in the address ADR based on the decoded result of the address ADR. The switch circuit 220 controls selection and non-selection of a word line WL and select gate lines SGD and SGS within a selected block BLK.

The switch circuit 220 connects the word line WL and the select gate lines SGD and SGS within the selected block to control lines corresponding to the wirings WL, SGD, and SGS within the block BLK that is selected among a plurality of control lines included in the wiring group 99.

The word line and select gate line driver 290 is connected to the wiring group 99 including a plurality of control lines. The word line and select gate line driver 290 transfers a voltage to be applied to the word line WL and the select gate lines SGD and SGS from the voltage generating circuit 40 to the wiring group 99. Therefore, various voltages are applied to the word line WL and the select gate lines SGD and SGS within the selected block BLK via a selected switch circuit 220.

The voltage generating circuit 40 includes a positive voltage circuit 410 and a negative voltage circuit 420.

A power supply voltage is supplied to the voltage generating circuit 40 via a power supply terminal (pad or pin) of the flash memory. The positive voltage circuit 410 generates various positive voltages used during the operation of the memory cell array 10, from the power supply voltage. The negative voltage circuit 420 generates various negative voltages (voltages lower than 0 V) used during the operation of the memory cell array 10, from the power supply voltage.

Figure 4:
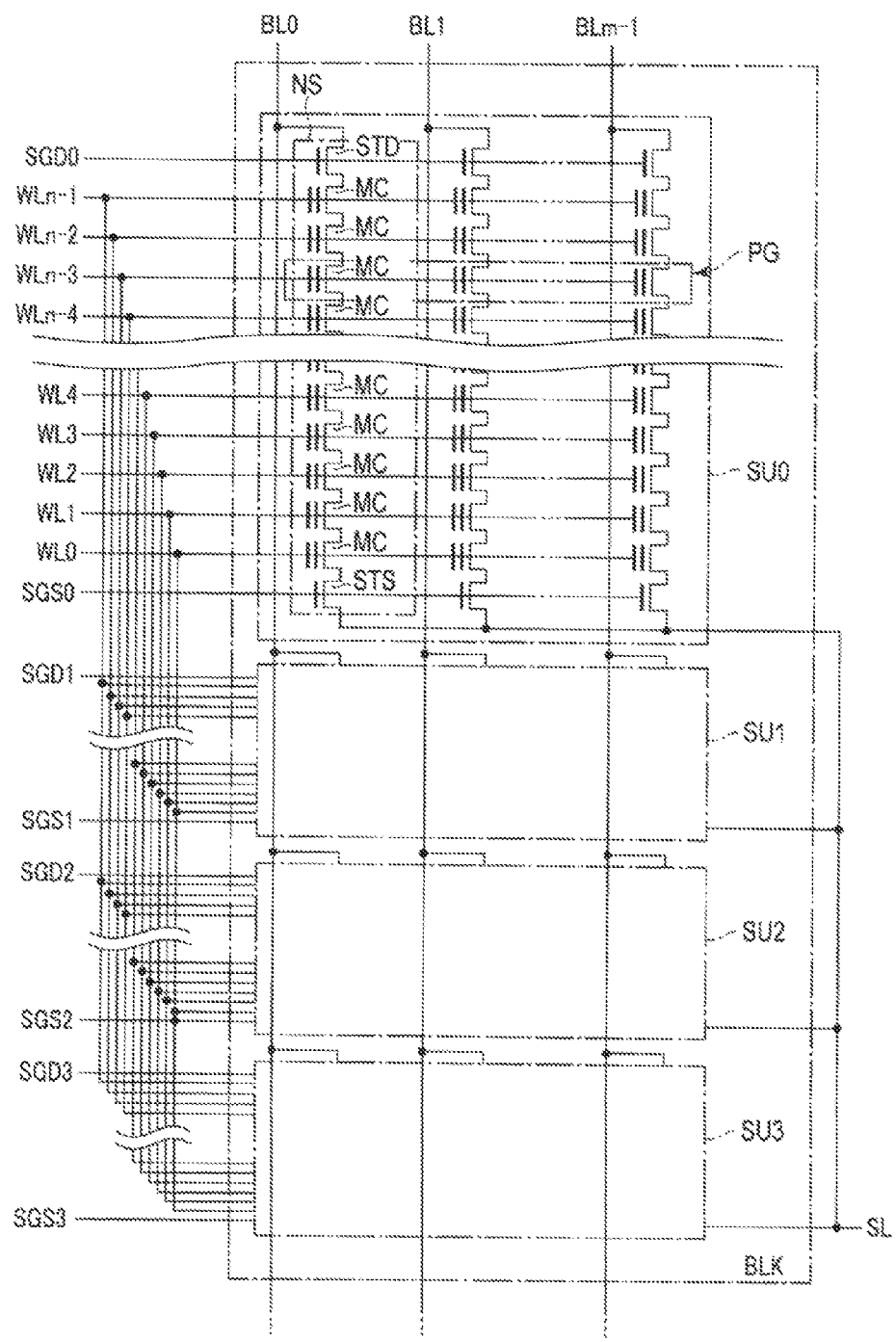
FIG. 4 is a circuit diagram illustrating an example of an internal configuration of a memory cell array of the memory device according to the embodiment.

In the example illustrated in FIG. 4, the memory cell array 10 has a three dimensional structure, in which one block BLK includes a plurality of (for example, four) string units SU (SU0, SU1, SU2, and SU3).

The plurality of string units SU includes a plurality of NAND strings (memory strings) NS. The NAND string NS includes a plurality of memory cells (also referred to as memory units or memory elements) MC and a plurality of select transistors STD and STS.

The number of the blocks BLK in the memory cell array 10, the number of the string units SU within one block BLK, and the number of the memory cells MC within the NAND string NS are arbitrarily determined.

The memory cell MC includes a control gate and a charge storage layer (memory film). Within the NAND string NS, the plurality of memory cells MC are connected in series between the select transistors STD and STS. One end (source or drain) of a drain-side memory cell MC among the plurality of memory cells MC connected in series is connected to one end of a drain-side select transistor STD. One end of a source-side memory cell MC among the plurality of memory cells MC connected in series is connected to one end of a source-side select transistor STS.

A plurality of word lines WL (WL0, WL1, ..., WLn-2, and WLn-1) are respectively connected to the gate of a corresponding memory cell MC. Symbol "n" represents a natural number of 2 or more. For example, one word line WL is connected in common to the plurality of memory cells MC within the plurality of string units SU. Writing of the data and reading of the data are performed collectively for the plurality of memory cells MC connected to any one word line WL in any one string unit SU. Unit PG of reading of the data and writing of the data is referred to as "page".

A plurality of drain-side select gate lines SGD (SGD0 to SGD3) are respectively connected to the gate of a plurality of drain-side select transistors STD of corresponding string units SU.

A plurality of source-side select gate lines SGS (SGS0 to SGS3) are respectively connected to the gate of a plurality of source-side select transistors STS of corresponding string units SU.

The other end of one drain-side select transistor STD is connected to one bit line BL (BL0, BL1, ..., or BLm-1). In addition, symbol "m" represents a natural number of 2 or more.

The other ends of the plurality of source-side select transistors STS are connected in common to a source line SL.

Figure 5:
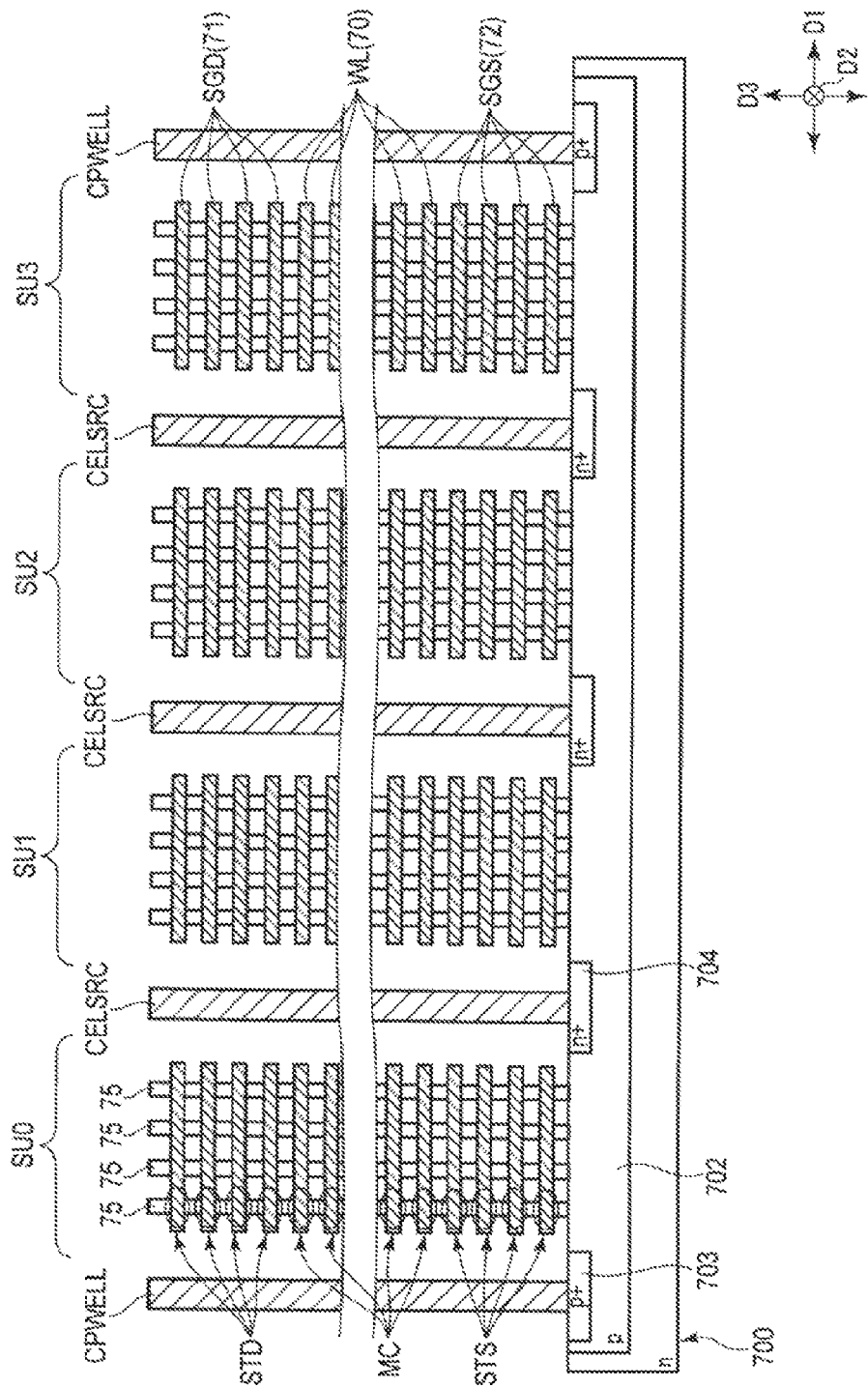
FIG. 5 is a sectional view illustrating a structure example of the memory cell array of the memory device according to the embodiment.

As in a schematic sectional structure view of the memory cell array illustrated in FIG. 5, the NAND string NS is provided on a p-type well region 702 within a semiconductor substrate (for example, Si substrate or a semiconductor region on an insulating layer) 700 within the memory cell array 10.

The p-type well region 702 is connected to the source line-well control circuit 50 via a well contact CPWELL. The p-type well region 702 defines the p-type well region for one block BLK. For example, the NAND string NS within the block BLK is provided within a region surrounded by the well contact CPWELL. The well contact CPWELL is provided on a p$^+$-type diffusion layer 703 within the p-type well region 702.

A source line contact CELSRC is provided on an n$^+$-type diffusion layer 704 within the p-type well region 702 between the string units SU. The source line contact CELSRC is connected to the source line SL (SRC).

The NAND string NS includes a semiconductor pillar 75. The semiconductor pillar 75 is connected to the p-type well region 702. The semiconductor pillar 75 extends in a direction (D3 direction) substantially perpendicular to the front surface of the p-type well region 702 (substrate). The semiconductor pillars 75 are arranged in a matrix configuration on the substrate 700 along a D1 direction and a D2 direction.

The bit line (not illustrated) is provided above an upper end of the semiconductor pillar 75.

A plurality of conductive layers 70, 71, and 72 are stacked on the p-type well region 702. Each of the conductive layers 70, 71, and 72 faces a side surface of the semiconductor pillar 75 via a memory film (not illustrated).

The drain-side select transistor STD is arranged in a region including the semiconductor pillar 75 and a conductive layer 71. A plurality (four in the embodiment) of stacked conductive layers 71 are gate electrodes of the select transistor STD. The plurality of stacked semiconductor layers 71 function as the drain-side select gate lines SGD.

The source-side select transistor STS is arranged in a region including the semiconductor pillar 75 and the conductive layer 72. A plurality of (four in the embodiment) stacked conductive layers 72 are the gate electrodes of the source-side select transistor STS. The plurality of stacked conductive layers 72 function as the source-side select gate lines SGS.

The memory cell MC is arranged in a region including the semiconductor pillar 75 and the conductive layer 70. The conductive layer 70 is a control gate electrode of the memory cell MC. One conductive layer 70 functions as one word line WL.

Figure 6:
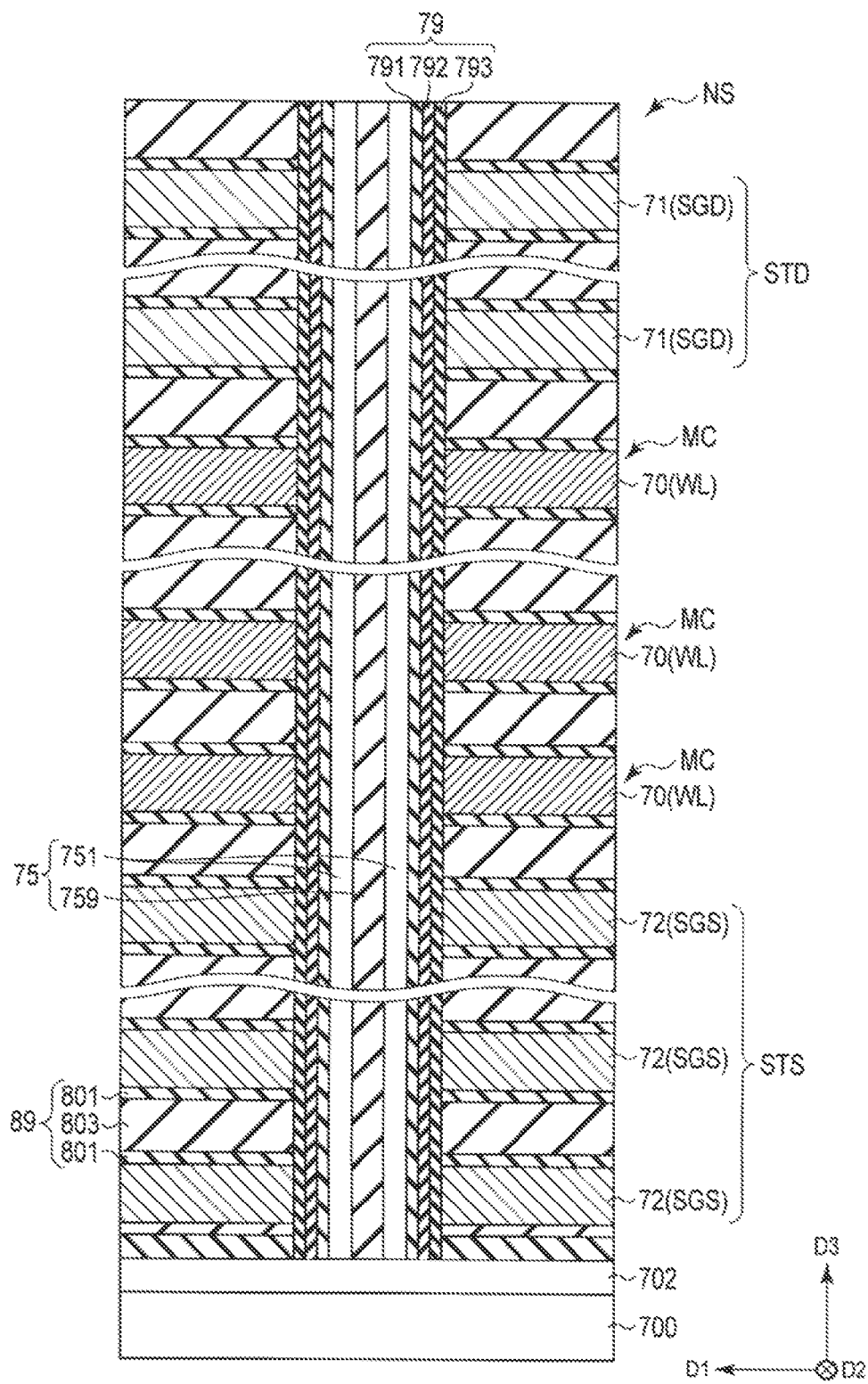
FIG. 6 is a sectional view illustrating an example of a structure of a memory cell of the memory device according to the embodiment.
Figure 7:
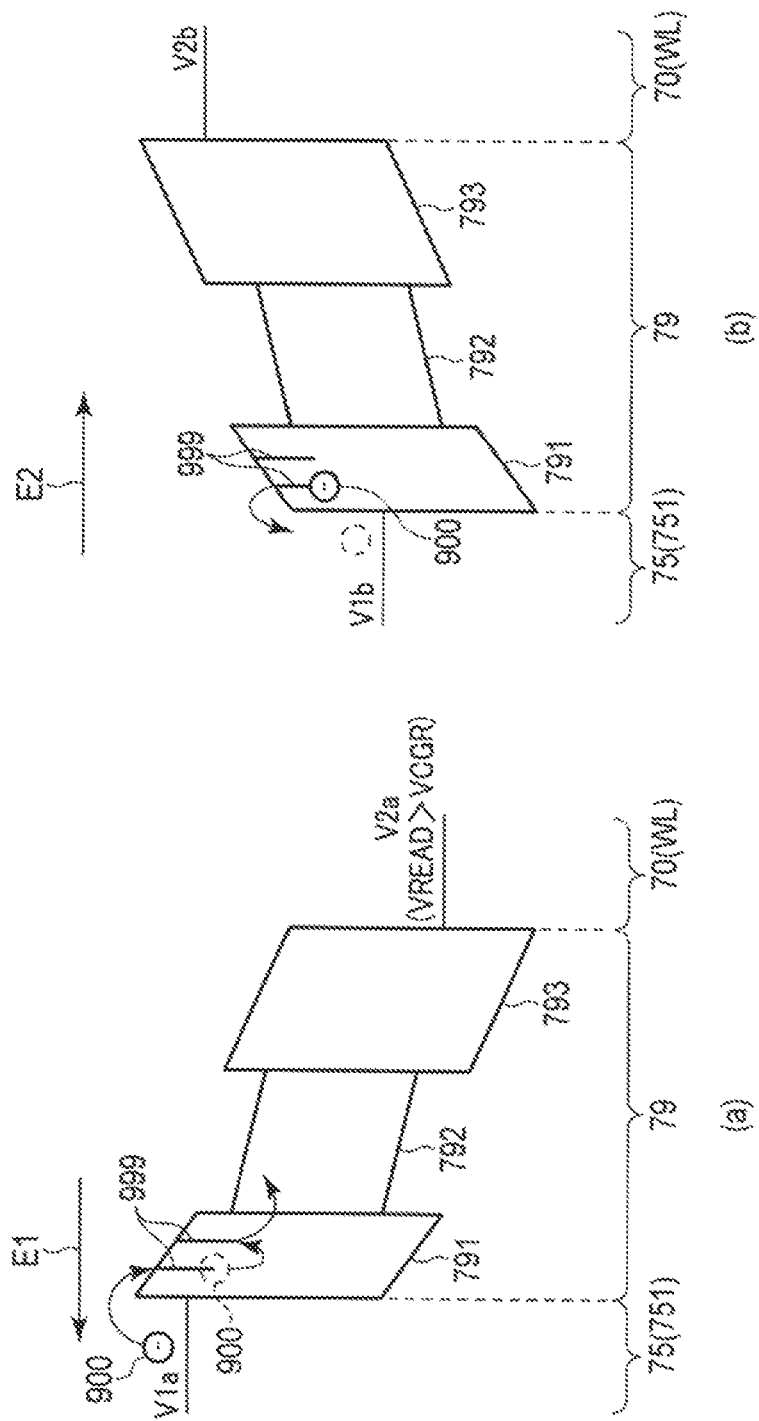
FIGS. 7A and 7B are views depicting an operation of the memory device according to the embodiment.

As illustrated in FIG. 6, the memory cell MC includes a memory film 79 between the semiconductor pillar 75 and the conductive layer (word line) 70. The memory film 79 covers a side surface of the semiconductor pillar 75. The memory film 79 is continuous between an upper end and a lower end of the semiconductor pillar 75.

The memory film 79 has a stacked structure. The memory film 79 includes a gate insulating film 791, a charge storage layer 792, and a block insulating film 793.

The gate insulating film (tunnel insulating film) 791 is provided on the side surface of the semiconductor pillar 75. The gate insulating film 791 has, for example, a stacked structure in which a silicon oxynitride film (SiON film) is interposed between two silicon oxide films. However, the gate insulating film 791 may be a single-layer structure of the silicon oxide film.

The charge storage layer 792 is provided between the gate insulating film 791 and the block insulating film 793. The charge storage layer 792 includes an insulating film (for example, SiN film) including a trap level. In addition, the charge storage layer 792 may include a semiconductor film (for example, silicon film). When the charge storage layer 792 includes the semiconductor film, the semiconductor films are separated from each other for each memory cell MC.

The block insulating film 793 is provided between the charge storage layer 792 and the conductive layers 70, 71, and 72. The block insulating film 793 includes, for example, a stacked structure of a silicon oxide film and an aluminum oxide film.

An interlayer insulating film 89 is provided between the conductive layers 70, 71, and 72 in the D3 direction (vertical direction with respect to the semiconductor substrate surface). The interlayer insulating film 89 includes, for example, two insulating films 801 and an insulating film 803. The insulating film 803 is interposed between the two insulating films 801.

In one embodiment, the semiconductor pillar 75 includes a core portion 759 and semiconductor regions 751. The core portion 759 includes a columnar insulator (for example, silicon oxide). The semiconductor regions 751 cover a side surface of the core portion 759. The semiconductor region 751 is a channel region of the memory cell MC. The semiconductor region 751 includes amorphous silicon or polysilicon.

Due to a manufacturing process of the memory cell array, a diameter of the semiconductor pillar 75 on a lower end side (source side of the NAND string NS) may be smaller than a diameter of the semiconductor pillar 75 on an upper end side (drain side of the NAND string).

The three dimensional structure memory cell array according to an embodiment may have the structure, operation, and manufacturing method described in "THREE-DIMENSIONAL STACKED NONVOLATILE SEMICONDUCTOR MEMORY" of U.S. patent application Ser. No. 12/407,403, filed on Mar. 19, 2009, in "THREE-DIMENSIONAL STACKED NONVOLATILE SEMICONDUCTOR MEMORY" of U.S. patent application Ser. No. 12/406,524, filed on Mar. 18, 2009, in "NONVOLATILE SEMICONDUCTOR STORAGE APPARATUS AND MANUFACTURING METHOD THEREOF" of U.S. patent application Ser. No. 12/679,991, filed on Mar. 25, 2010, and in "SEMICONDUCTOR MEMORY AND MANUFACTURING METHOD THEREOF" of U.S. patent application Ser. No. 12/532,030, filed on Mar. 23, 2009. All of these application are incorporated by reference herein in their entirety.

A read voltage VCGR is applied to a selected word line and a read pass voltage VREAD is applied to an unselected word line during the reading operation of the flash memory. A voltage value of the read pass voltage VREAD is larger than a voltage value of the read voltage VCGR.

As illustrated in FIG. 7A, in a case where the read pass voltage VREAD is applied to the unselected word line, when a potential (voltage) V2a of the control gate electrode 70 is higher than a potential Via of the semiconductor pillar 75, a level of an energy band on the control gate electrode 70 side is lower than a level of an energy band on the semiconductor pillar 75 side.

In this case, a direction of an electric field E1 applied to the memory film 79 is a direction from the control gate electrode 70 to the semiconductor pillar 75. Electrons (negative charge) are moved into the memory film 79 by the electric field E1. In this case, electrons 900 may be trapped in a trap level 999 of the gate insulating film 791 of the memory film 79.

Furthermore, the electrons 900 trapped into the gate insulating film 791 is gradually moved via the defect (trap level) 999 within the gate insulating film 791 and may be injected into the charge storage layer 792 by application of a voltage more than once to the word line.

As a result of the trap of the electrons within the gate insulating film 791 or transfer of the electrons from the gate insulating film 791 to the charge storage layer 792, variation in a threshold voltage of the memory cell MC may occur.

When a threshold voltage of the memory cell is shifted from a voltage distribution corresponding to data to be stored by the transfer of the electrons by a voltage applied to the unselected word line during the reading operation, an operation of the flash memory may fail. The failure of the memory due to such a reading operation is referred to as reading disturbance.

As illustrated in FIG. 7B, the flash memory according to the embodiment respectively applies the voltages (potentials) V2b and V1b having certain magnitudes to the unselected word line WL and the semiconductor pillar 75 so that the electric field E2 in a direction opposite to the direction of the electric field E1 is applied to the memory film 79 after application (state in FIG. 7A) of the voltages VCGR and VREAD for reading of the data to each word line WL during the reading operation. Therefore, the potential of the semiconductor pillar 75 is higher than the potential of the control gate electrode 70.

When the potential V1b of the semiconductor pillar 75Y is higher than the potential V2b of the control gate electrode 70, the level of the energy band on the semiconductor pillar 75 side is lower than the level of band energy on the control gate electrode 70 side.

In this case, the direction of the electric field E2 applied to the memory film 79 is a direction from the semiconductor pillar 75 to the control gate electrode 70. Charge (electrons) that is negatively charged is moved in the direction opposite to the direction of the electric field.

Therefore, the electrons 900 that are trapped within the gate insulating film 791 are moved toward the semiconductor pillar 75 on a high potential side with respect to the memory film 79 by application of the electric field E2 (voltages V1b and V2b).

As a result, the flash memory according to the embodiment can suppress movement of the electrons within the gate insulating film 791 to the charge storage layer 792.

Therefore, the flash memory according to the embodiment can suppress occurrence of the reading disturbance.

Therefore, the memory device according to the embodiment can improve reliability of the memory.

(b) Operation Example

An operation example (control method) of the memory device according to the first embodiment will be described with reference to FIG. 8. Here, the operation of the memory device according to the embodiment will be described with reference to FIGS. 1 to 7 appropriately in addition to FIG. 8.

Hereinafter, the reading operation of the flash memory as the memory device according to the embodiment will be described.

Time T0

For example, the memory controller 5 transmits a reading command CMD1 (00h and xxh) and the address (selected address) ADR from which the data is to be read to the flash memory 1 in response to a request from the host device 600 at time T0.

In the embodiment, the reading command CMD1 includes a first signal 00h and a second signal xxh. The first signal 00h indicates that the operation to be executed by the flash memory 1 is a reading operation. The second signal xxh indicates an instruction to start the reading operation. In addition, the second signal xxh indicates that a recovery operation is to be executed.

In the embodiment, as illustrated in FIG. 7B, the recovery operation is an operation for controlling the potential of the word line WL and the potential of the semiconductor pillar 75 so that the electric field E2 in a direction from the semiconductor pillar 75 to the control gate electrode 70 is applied to the memory film 79 of the memory cell MC.

In addition, hereinafter, as a way to distinguish the description of operations within the reading operation, an operation for determining the threshold voltage of the memory cell by application of the read voltage to the selected word line is referred to as a sensing operation.

The flash memory 1 receives the reading command CMD1 and the selected address ADR. The sequencer 19 starts the reading operation based on the reading command CMD1.

As described below, the sequencer 19 controls each circuit within the flash memory 1 so as to execute the reading operation including the sensing operation and the recovery operation.

Time T1

At time T1, the sequencer 19 performs transition of a signal level of a ready/busy signal R/B from a high (H) level to a Low (L) level. Therefore, starting of the reading operation in the flash memory 1 is notified to the memory controller 5.

The voltage generating circuit 40 generates various voltages using for the reading operation by the control of the sequencer 19. For example, the positive voltage circuit (power supply circuit) 410 generates various positive voltages used for reading of the data by using the power supply voltage.

The sense amplifier circuit 30 charges the bit line BL by the control of the sequencer 19. Therefore, the potential of the bit line BL is substantially set as a voltage VBL of a certain magnitude.

Time T2 to Time T3

The sensing operation is executed in a period from time T2 to time T3.

At time T2, the source line-well control circuit 50 applies a voltage VSRC to the source line SRC (SL).

The row control circuit 20 applies a select gate voltage VSG to a selected drain-side select gate line SGD and a selected source-side select gate line SGS for a selected string unit SU within a selected block BLK. The select transistors STD and STS are turned on.

The bit line BL is electrically connected to the semiconductor pillar 75 via the select transistor STD in an ON state. The source line SRC is electrically connected to the semiconductor pillar 75 via the select transistor STS in an ON state and the well region 702.

The row control circuit 20 applies the read pass voltage VREAD (>VCGR) to an unselected word line otherWLs. Unselected cells to which the read pass voltage VREAD is applied are turned on.

The row control circuit 20 applies the read voltage VCGR to a selected word line WLk.

For the memory cell MC connected to the selected word line WLk, the memory cell MC having the threshold voltage equal to or less than the read voltage VCGR is turned on and the memory cell MC having the threshold voltage greater than the read voltage VCGR is turned off.

When the selected cell MC is turned on by the application of the read voltage VCGR, a current (cell current) flows between the bit line BL and the source line SRC. In this case, a potential of a node connected to the bit line BL within the sense amplifier circuit 30 is varied. On the other hand, when a selected cell is turned off during application of the read voltage VCGR, the current does not flow between the bit line BL connected to the selected cell in an OFF state and the source line SL. In this case, the potential of the node connected to the bit line BL is not varied.

The sense amplifier circuit 30 senses presence or absence of generation (or variation of the potential of the node) of the current in each bit line. The sense amplifier circuit 30 incorporates a signal corresponding to a sensing result into a latch corresponding to each bit line.

As described above, for the data of 1 bit, it is determined whether data stored in the memory cell MC is "1" data or "0" data by using the read voltage VCGR as a reference (determination level).

The electrons may be trapped within the gate insulating film of the memory cell MC connected to the unselected word line otherWLs by application of the read pass voltage VREAD to the unselected word line otherWLs.

Figure 8:
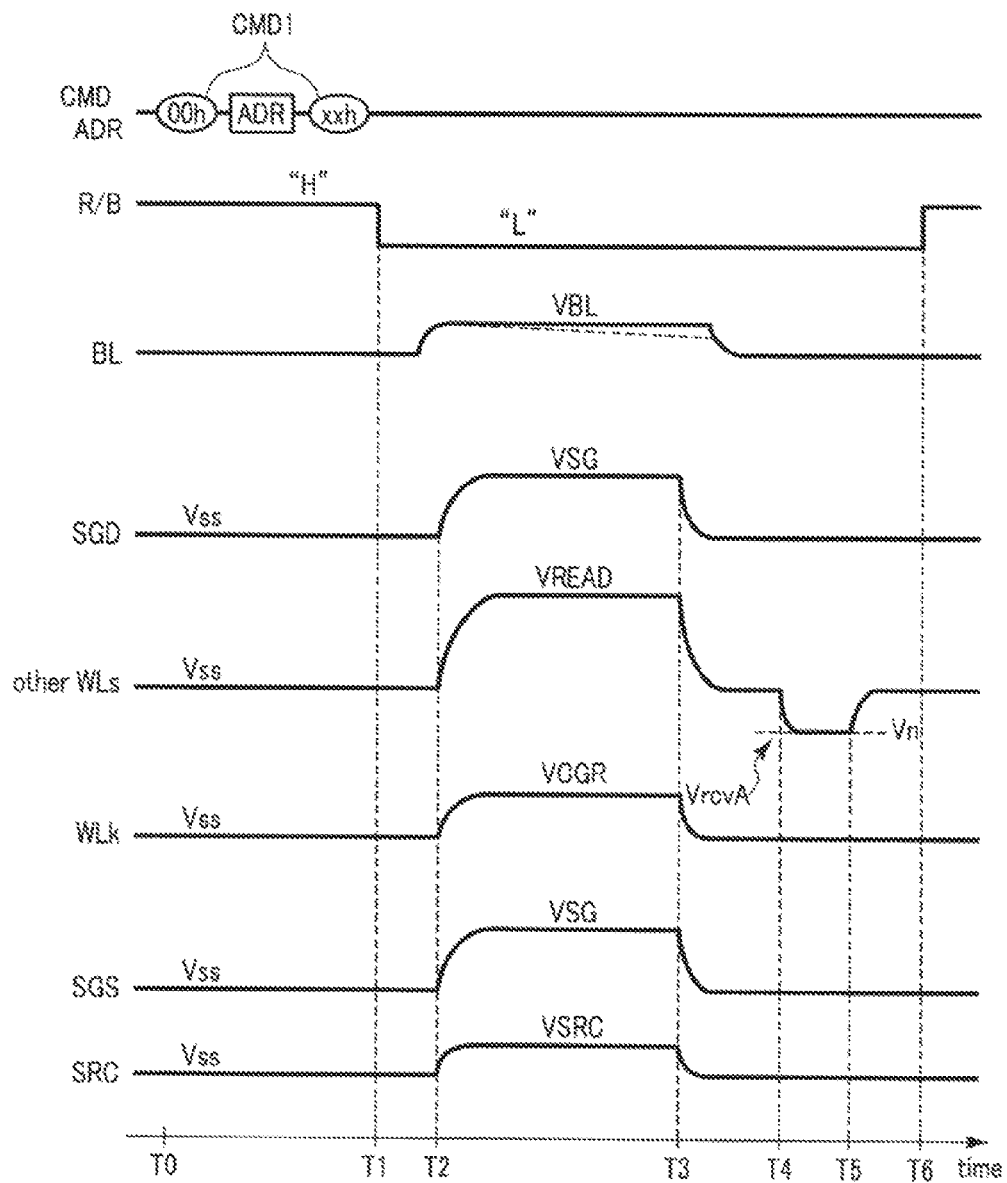
FIG. 8 is a timing chart illustrating an operation example of the memory device according to a first embodiment.

In addition, in FIG. 8, in order to read the data of 1 bit, a voltage value of the read voltage VCGR is set as a constant value. However, when one memory cell stores data of 2 bits or more, in order to continuously read the data within the memory cell MC by 1 bit, the read voltage VCGR may include a plurality of voltage values.

After presence or absence of occurrence of the current generation in the bit line BL is sensed, the sequencer 19 sequentially sets the potential of each of wirings BL, WLk, otherWLs, SGD, and SGS within the memory cell array 10 as a voltage Vss after time T3.

As described above, the data within the selected cell is read by the sensing operation in the period from time T2 to time T3.

Time T4 to Time T5

The recovery operation is executed in a period from time T4 to time T5.

The voltage generating circuit 40 generates a voltage (hereinafter, referred to as a recovery voltage) Vrcv (VrcvA) for the recovery operation using the power supply voltage. In the embodiment, the recovery voltage VrcvA has a negative voltage value Vn (<0). The negative voltage circuit 420 outputs the recovery voltage VrcvA having the negative voltage value.

At time T4, the row control circuit 20 applies the recovery voltage VrcvA to the unselected word line otherWLs by the control of the sequencer 19.

The row control circuit 20 applies a ground voltage Vss to the selected word line WLk and the select gate lines SGD and SGS during application of the recovery voltage VrcvA having the negative voltage value Vn. The sense amplifier circuit 30 applies the ground voltage Vss to the bit line BL. The source line-well control circuit 50 applies the ground voltage Vss to the source line SRC.

The potential of the semiconductor pillar 75 is higher than the potential of the unselected word line otherWLs in a period in which the recovery voltage VrcvA is applied. As illustrated in FIG. 7B, the electric field E2 is generated between the control gate electrode (word line) 70 and the semiconductor pillar 75 according to a potential difference between the word line WL and the semiconductor pillar 75.

As in the embodiment, when the recovery voltage VrcvA of the negative voltage value Vn is applied to the control gate electrode 70, the direction of the electric field E2 applied to the memory film 79 is a direction from the semiconductor pillar 75 to the control gate electrode 70.

The electrons trapped within the gate insulating film 791 due to the application of the read pass voltage VREAD is moved from the gate insulating film 791 to the semiconductor pillar 75 by the electric field E2. For example, the electrons within the gate insulating film 791 are released into the semiconductor pillar 75.

At time T5, the row control circuit 20 stops the application of the recovery voltage VrcvA. The potential of the unselected word line otherWLs is set as the ground potential (ground voltage) Vss.

As described above, the recovery operation is executed so that the electrons trapped within the gate insulating film 791 are moved on the semiconductor pillar 75 side in the period from time T4 to time T5.

For example, an absolute value (absolute value of intensity of the electric field E2) of the voltage value of the recovery voltage Vrcv is equal to or less than a potential difference (absolute value of intensity of the electric field E1) between the read pass voltage VREAD and the semiconductor pillar 75.

A period (period from time T4 to time T5), in which the recovery voltage VrcvA is applied to the word line otherWLs, is appropriately set based on a results of an experiment and a result of a test process with respect to the flash memory. However, the period from time T4 to time T5 may be changed according to a usage status of the flash memory. When deterioration of a reading speed of the flash memory is suppressed, it is preferable that the period (period of the recovery operation) from time T4 to time T5 is equal to or less than the period (period of the sensing operation) from time T2 to time T3.

In addition, in the recovery operation, it is possible to reduce the period for the recovery operation by increasing the absolute value of the recovery voltage within an allowable range of the voltage value and the period. In contrast, the absolute value of the recovery voltage can be reduced by increasing the period for the recovery operation.

At time T6, the sequencer 19 changes the signal level of the ready/busy signal R/B to be the H level. Therefore, completion of the reading operation within the flash memory is notified to the memory controller 5.

In addition, the data read from the memory cell can be transmitted from the flash memory 1 to the memory controller 5 in parallel to execution of the recovery operation or after the recovery operation.

As described above, the reading operation of the flash memory 1 is completed.

In the flash memory according to the embodiment, a known technique can be applied to a writing operation and the erasing operation. Therefore, description of the writing operation and the erasing operation of the flash memory according to the embodiment will be omitted.

(c) Summary

In the flash memory as the memory device according to the embodiment, the read voltage is applied to the selected word line and the read pass voltage higher than the read voltage is applied to the unselected word line during the reading operation of the flash memory.

The electrons may be trapped within the gate insulating film of the memory cell connected to the unselected word line by the application of the read pass voltage.

The flash memory according to the embodiment controls the potential difference between the unselected word line and the semiconductor pillar so that the electric field E2 in the direction from the semiconductor pillar to the word line is applied to the memory film within the memory cell after the application of the read voltage and the read pass voltage.

Thus, the electrons trapped within the gate insulating film moves to the semiconductor pillar side. Therefore, the flash memory according to the embodiment can suppress the reading disturbance.

As in the embodiment, as a result of being capable of suppressing the reading disturbance, the flash memory according to the embodiment can achieve reading of data having high reliability without using the ECC circuit having a high correction capability. Accordingly, the flash memory according to the embodiment can suppress an increase in a chip cost that would otherwise be necessitated by mounting the ECC circuit having high correction capability.

As described above, the memory device according to the embodiment can improve reliability of the memory.

(2) Second Embodiment

A memory device and a control method thereof according to a second embodiment will be described with reference to FIG. 9.

In the embodiment, two or more regions that are logically divided are set within an NAND string NS. In the embodiment, recovery voltages having different magnitudes are used for two or more regions during the recovery operation in the reading operation.

Here, a case in which two regions R1 and R2 are set within one NAND string NS will be described. One region R1 is on a source side of the NAND string NS and is referred to as a lower region R1, and the other region R2 is on a drain side of the NAND string NS and is referred to as an upper region R2. The lower region R1 is positioned between the upper region R2 and the well region 702 in an extending direction of the semiconductor pillar 75.

For example, a first word line WL0 to an ith word line WLi-1 from the well region (substrate) side is assigned to the lower region R1. An (i+1)th word line WLi to an nth word line WLn-1 from the well region side is assigned to the upper region R2. In this example, i is a natural number represented by n/2.

Figure 9:
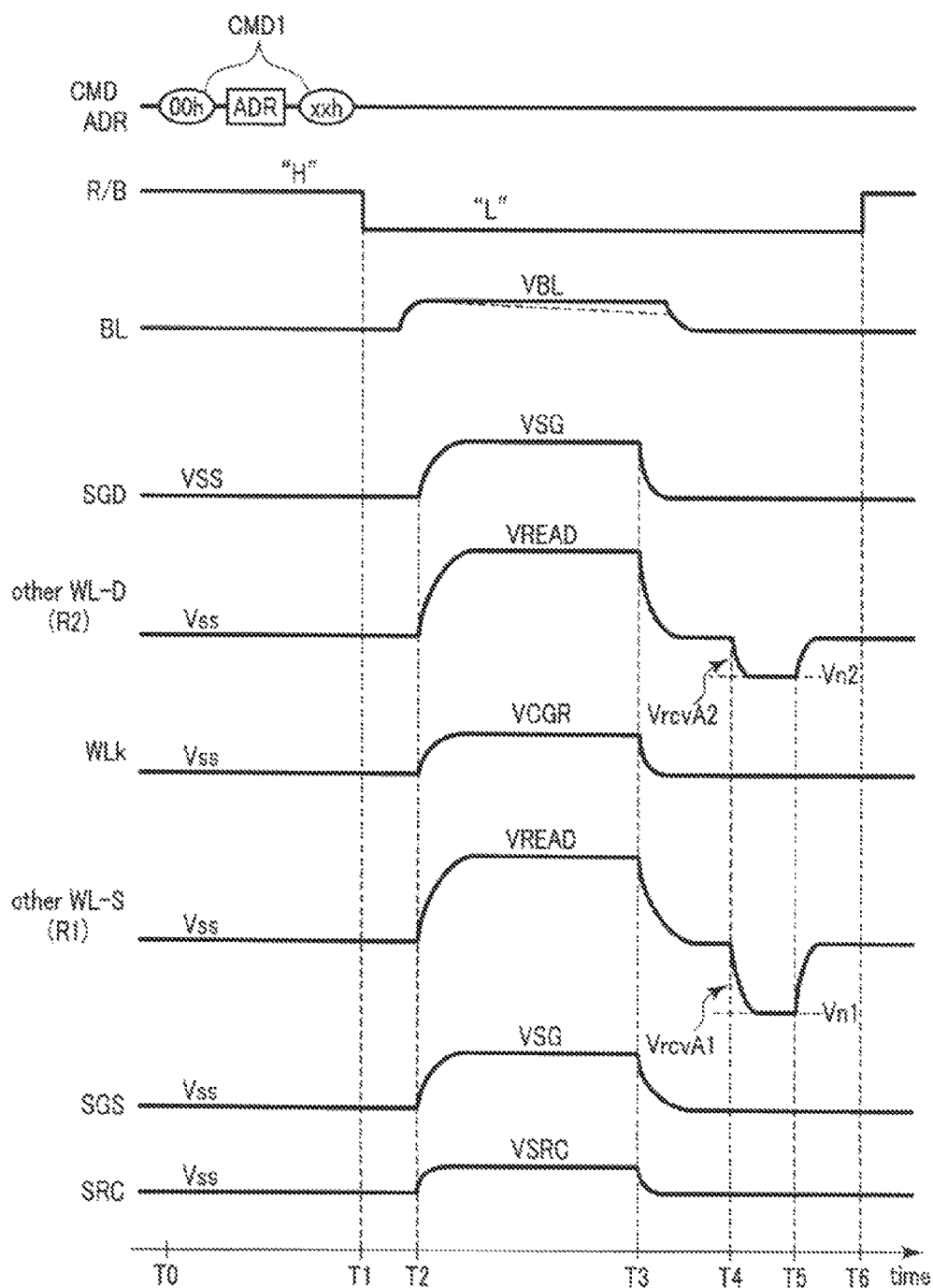
FIG. 9 is a timing chart illustrating an operation example of a memory device according to a second embodiment.

As illustrated in a timing chart in FIG. 9, at time T4 after a sensing operation similar to the first embodiment, the recovery voltages VrcvA1 and VrcvA2 are applied to a plurality of the unselected word lines otherWL-D and otherWL-S.

The recovery voltage VrcvA1 is applied to the unselected word line otherWL-S within the lower region R1 and the second recovery voltage VrcvA2 is applied to the unselected word line otherWL-D within the upper region R2 by control of a sequencer 19. The first and second recovery voltages VrcvA1 and VrcvA2 respectively have the negative voltage values Vn1 and Vn2.

In the embodiment, an absolute value of the voltage value Vn1 of the recovery voltage VrcvA1 is greater than an absolute value of the voltage value Vn2 of the recovery voltage VrcvA2.

At time T5, a row control circuit 20 sets potentials of the unselected word lines otherWL-D and otherWL-S as a ground voltage Vss.

As described above, in the embodiment, the recovery operation is executed by respectively applying the recovery voltages VrcvA1 and VrcvA2 having different voltage values to the unselected word lines within different regions R1 and R2.

For example, a diameter of a portion on the substrate side (lower region side) of the semiconductor pillar 75 tends to be smaller than a diameter of a portion on the bit line side (upper region side) of the semiconductor pillar 75 due to a manufacturing process for forming a memory cell array of a three dimensional structure.

In such a semiconductor pillar structure, even when a read pass voltage VREAD applied to the word line WL within the lower region R1 has the same magnitude as that of a read pass voltage VREAD applied to the word line WL within the upper region R2, an electric field applied to a memory film 79 of the memory cell MC in which the diameter of the semiconductor pillar is small is stronger than an electric field applied to the memory film 79 of the memory cell MC in which the diameter of the semiconductor pillar is large. Therefore, reading disturbance is likely to occur in the memory cell MC within the lower region R1 compared to the memory cell within the upper region R2.

As in the embodiment, different recovery voltages are applied to each of a plurality of regions set within the NAND string NS, whereby it is possible to apply an electric field having strength suitable for suppressing the reading disturbance to the gate insulating film according to a structure (shape) of the semiconductor pillar 75.

In addition, one NAND string may include a plurality of stacked semiconductor pillars. For example, when two semiconductor pillars are stacked, in the vertical direction with respect to the substrate surface, an upper portion of a semiconductor pillar on a lower side is adjacent to a lower portion of the semiconductor pillar on a upper side. In each of the semiconductor pillars on the lower side and the upper side, a diameter of the lower portion of the semiconductor pillar is smaller than a diameter of upper portion of the semiconductor pillar. Therefore, it is preferable that an absolute value of the recovery voltage to the unselected word line within the lower region of the semiconductor pillar on the upper side is greater than an absolute value of the recovery voltage to the unselected word line within the upper region of the semiconductor pillar on the lower side during the recovery operation.

As described above, the absolute value of the recovery voltage applied to the unselected word line within a certain region may be smaller than the absolute value of the recovery voltage applied to the selected word line within a region positioned above the certain region according to the structure of one or more semiconductor pillars within the NAND string.

As described above, in the memory device according to the embodiment, it is possible to obtain the same effects as those of the first embodiment.

(3) Third Embodiment

A memory device and a control method thereof according to a third embodiment will be described with reference to FIG. 10.

In a flash memory according to the embodiment, a potential of a semiconductor pillar is controlled during a recovery operation. Therefore, in the embodiment, similar to other embodiments, an electric field in a direction from the semiconductor pillar to a control gate electrode is applied to a gate insulating film.

Figure 10:
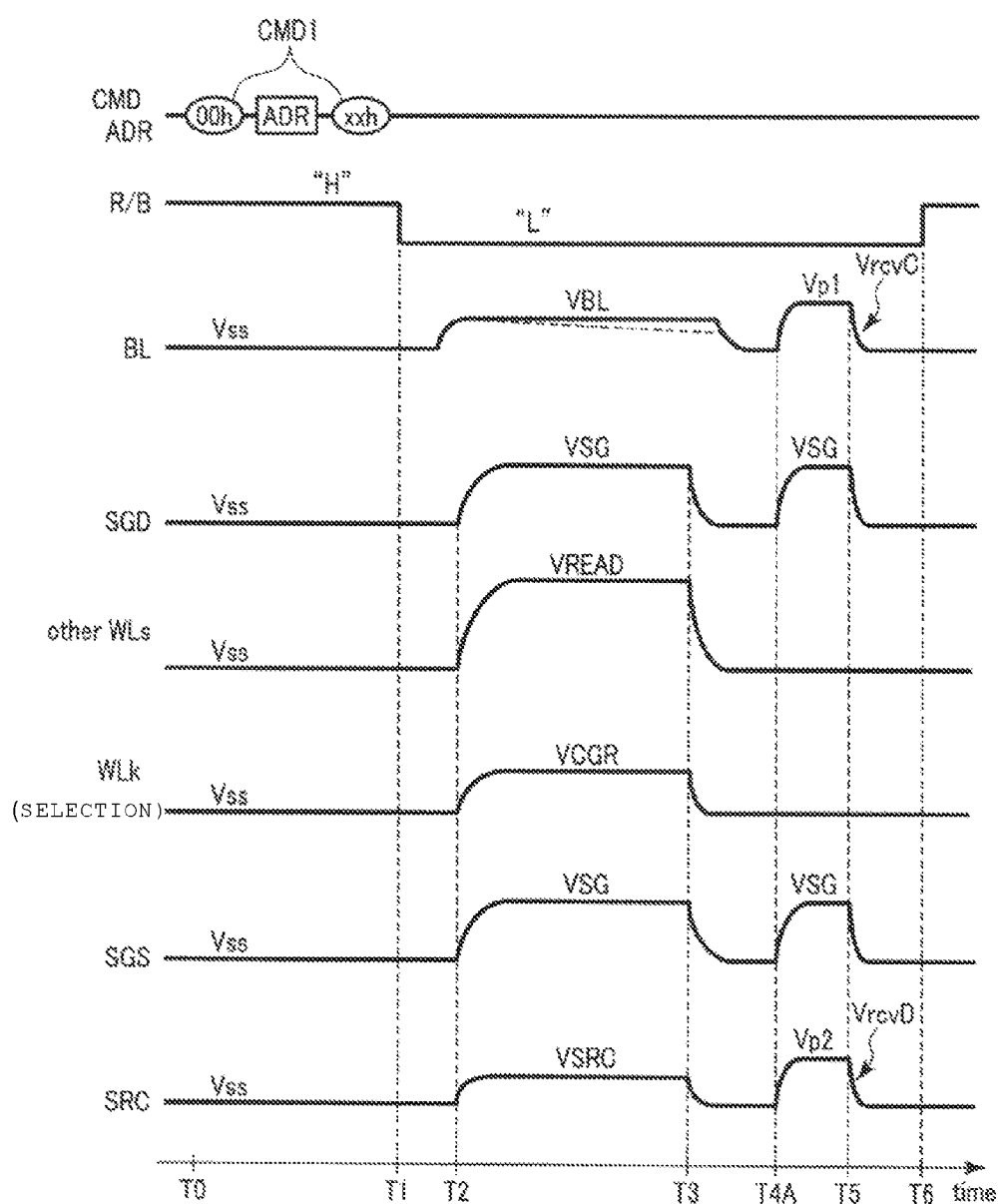
FIG. 10 is a timing chart illustrating an operation example of a memory device according to a third embodiment.

As illustrated in a timing chart in FIG. 10, similar to the above embodiments, each of circuits 20, 30, and 40 sets potentials of selected and unselected word lines WLk and otherWLs, potentials of select gate lines SGD and SGS, a potential of a source line SRC as a ground voltage Vss by control of a sequencer 19 at time T3 after a sensing operation.

In the recovery operation in the flash memory according to the embodiment, in a state in which the potentials of the selected and unselected word lines WL are maintained in the ground voltage Vss at time T4, various voltages VSG, VrcvC, and VrcvD are respectively applied to the drain-side and source-side select gate lines SGD and SGS, the bit line BL, and the source line SRC by the control of the sequencer 19.

A row control circuit 20 applies a voltage VSG to the drain-side and source-side select gate lines SGD and SGS. Therefore, select transistors STD and STS are turned on. The row control circuit 20 applies the ground voltage Vss to the word lines WLk and WLothers.

A sense amplifier circuit 30 applies the recovery voltage VrcvC to the bit line BL. A source line-well control circuit 50 applies the recovery voltage VrcvD to the source line SRC.

The recovery voltages VrcvC and VrcvD respectively have positive voltage values Vp1 and Vp2. The voltage value Vp1 of the recovery voltage VrcvC has substantially the same magnitude as that of the voltage value Vp2 of the recovery voltage VrcvD. However, the voltage value Vp1 has a magnitude different from that of the voltage value Vp2.

The voltage VrcvC applied to the bit line BL is applied to the semiconductor pillar 75 via the select transistor STD in an ON state. In addition, the voltage VrcvD applied to the source line SL is applied to the semiconductor pillar 75 via a well region 702 and the select transistor STS in the ON state.

Therefore, an internal potential of the semiconductor pillar 75 is higher than a potential of a control gate electrode (word line) 70 to which the ground voltage Vss is applied.

Therefore, an electric field E2 in a direction from the semiconductor pillar 75 to the control gate electrode 70 is applied to a gate insulating film 791.

As a result, electrons trapped within the gate insulating film 791 move on the semiconductor pillar side. For example, the electrons in the gate insulating film 791 are discharged to the semiconductor pillar 75.

Thereafter, at time T5, each of the circuits 20, 30, and 40 sets the potentials of the select gate lines SGD and SGS, the bit line BL, and the source line SRC as the ground voltage Vss by the control of the sequencer 19.

In addition, during a period from time T4 to time T5, when a voltage applied to the unselected word line is a voltage lower than the recovery voltages VrcvC and VrcvD applied to the semiconductor pillar, the voltage may be a voltage (for example, voltage of approximately 0.5 V to 0.7 V) greater than the ground voltage (0 V).

As described above, in the flash memory according to the embodiment, the potential of the semiconductor pillar 75 is higher than the potential of the unselected word line by applying a positive voltage to the semiconductor pillar 75 during the recovery operation. Therefore, in the flash memory according to the embodiment, it is possible to suppress reading disturbance due to the electrons trapped within the gate insulating film.

In addition, in the flash memory according to the embodiment, it is possible to execute the recovery operation without using a negative voltage. Therefore, in the flash memory according to the embodiment, it is possible to reduce a negative voltage circuit.

Therefore, in the memory device according to the embodiment, it is possible to improve reliability of the operation.

(4) Fourth Embodiment

A memory device and a control method thereof according to a fourth embodiment will be described with reference to FIG. 11.

One or more dummy word lines may be provided within a NAND string depending on an internal configuration of a memory cell array.

For example, the word line WL0 and the word line WLn-1 in FIG. 4 are used as dummy word lines DWL (DWLD and DWLS). The source-side dummy word line DWLS (word line WL0) is provided within the NAND string NS so as to be adjacent to the source-side select gate line SGS. The drain-side dummy word line DWLD (word line WLn-1) is provided within the NAND string NS so as to be adjacent to the drain-side select gate line SGD.

Memory cells (hereinafter, referred to as dummy cells) DC connected to the dummy word line DWL have the same structure as that of the memory cells MC. The dummy cells DC are not used for data storage.

A voltage having a certain magnitude is applied to the dummy word line DWL during a writing operation and a reading operation of the flash memory similar to application of a voltage to the unselected word line.

Therefore, the electrons may be trapped within the gate insulating film of the dummy cell DC by a plurality of applications of the voltage to the dummy word lines DWLD and DWLS.

When the electrons trapped within the gate insulating film are injected within the charge storage layer of the dummy cell DC, the threshold voltage of the dummy cell DC is increased. As a result, even when an ON voltage of the dummy cell that is set based on the specification or regulation is applied to the dummy word line DWL, the dummy cell DC may not be turned on. Therefore, similar to the memory cell, it is preferable that the recovery operation is executed with respect to the dummy cell after the voltage is applied to the dummy word line.

Figure 11:
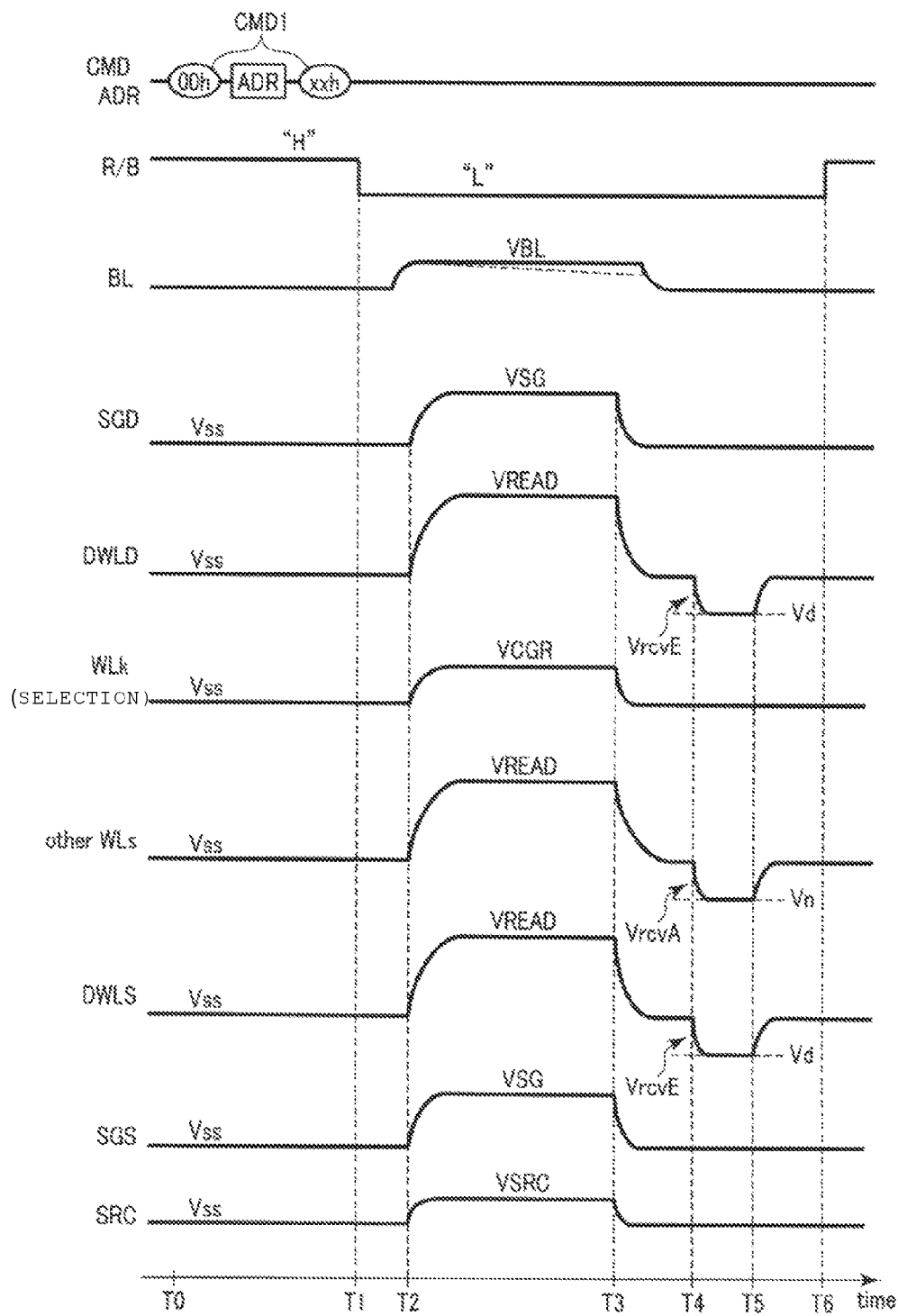
FIG. 11 is a timing chart illustrating an operation example of a memory device according to a fourth embodiment.

As illustrated in the timing chart in FIG. 11, at time T2, similar to the reading operation described above, the row control circuit 20 applies various voltages VCGR, VREAD, and VSG to each of wirings WLk, otherWLs, SGD, and SGS.

In the embodiment, the row control circuit 20 applies a read pass voltage VREAD to the dummy word line DWL and the unselected word line otherWLs.

At time T3, the row control circuit 20 sets potentials of the selected word line WLk, the unselected word line otherWLs, and the select gate lines SGD and SGS as the ground voltage Vss.

The row control circuit 20 sets the potential of the dummy word line DWL as the ground voltage Vss.

As described above, data within the selected cell is read by the sensing operation. Thereafter, the sequencer 19 executes the recovery operation.

At time T4, the row control circuit 20 applies a recovery voltage VrcvA of a negative voltage value Vn to the unselected word line otherWLs. Along with this, the row control circuit 20 applies a recovery voltage VrcvE to the dummy word lines DWLD and DWLS by control of the sequencer 19.

Therefore, similar to the unselected cell MC, an electric field E2 in a direction from the semiconductor pillar 75 to the control gate electrode 70 is applied to the gate insulating film 791 of the dummy cell DC. Therefore, the electrons trapped within the gate insulating film 791 of the dummy cell DC move on the semiconductor pillar 75 side.

Therefore, in the flash memory according to the embodiment, it is possible to suppress variation of a threshold voltage in the dummy cell DC.

In addition, as in the third embodiment, the recovery voltage of a positive voltage value is applied to the semiconductor pillar 75 and the ground voltage is applied to the dummy word lines DWLD and DWLS. Therefore, the electric field E2 in the direction from the semiconductor pillar 75 to the gate electrode 70 may be applied to the gate insulating film 791 of the dummy cell DC.

In addition, select transistors STD and STS also include the memory films. Therefore, in order to suppress variation of the threshold voltage of the select transistors STD and STS due to the application of the voltage, the recovery voltage may be applied to the select gate lines SGD and SGS similar to the dummy word lines DWLD and DWLS.

As described above, in the memory device according to the embodiment, it is possible to improve reliability of the operation.

(5) Application Example

An application example of a memory device according to the embodiment will be described with reference to FIGS. 12 and 13.

For example, in a memory system (or storage device) including the memory device according to the embodiment, presence or absence of a recovery operation is controlled during reading of data based on a command from a memory controller 5.

Figure 12A:
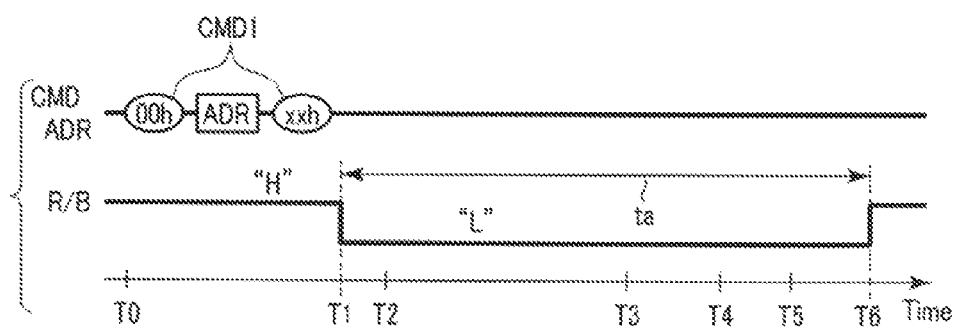
FIGS. 12A and 12B are diagrams depicting command sequences of the memory device according to the embodiment.

As illustrated in FIG. 12A, when a flash memory 1 receives a first reading command CMD1 including the second signal xxh described above, a sequencer 19 executes a reading operation including one recovery operation of the embodiments described above based on setting information according to the flash memory 1.

In reading of the data available execution of the recovery operation, a ready/busy signal R/B is set as a L level in a period to (for example, a period from time T1 to Time T6 in FIG. 8).

Figure 12B:
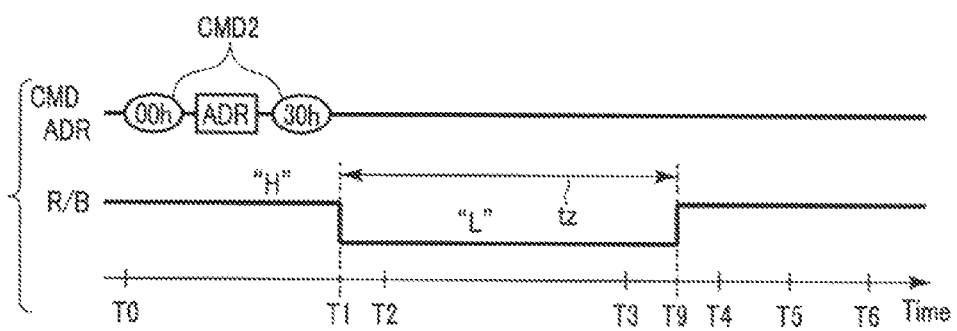

As illustrated in FIG. 12B, when the flash memory 1 receives a second reading command CMD2 including a first signal 00h and a third signal 30h, the sequencer 19 executes reading (for example, only a sensing operation) of the data without execution of the recovery operation.

For example, the reading operation based on the second reading command CMD2 is completed at time T9 between time T3 and time T6 in FIG. 8. In reading of the data without execution of the recovery operation, the ready/busy signal R/B is set as a L level in a period tz (period from time T1 to time T9). The period tz is shorter than a period ta. In addition, it is more preferable that time T9 is a time between time T3 and time T4 (within a transition period of the sensing operation and the recovery operation).

For example, the memory controller 5 transmits reading commands CMD1 and CMD2 including one of second and third signals xxh and 30h according to a usage status (for example, access frequency) of the flash memory 1.

For example, a CPU 500 counts the number of readings with respect to each address (page address). The CPU 500 stores a relationship between the address (word line) and the number of readings within a DRAM 501 as a management table TBL.

When reading of certain data is required by a host device 600, the memory controller 5 compares the number of readings with respect to the address in which certain data is stored with a certain determination value.

For example, the flash memory 1 and the memory system 9 (storage device 601) including the flash memory 1 according to the embodiment are operated as follows.

Figure 13:
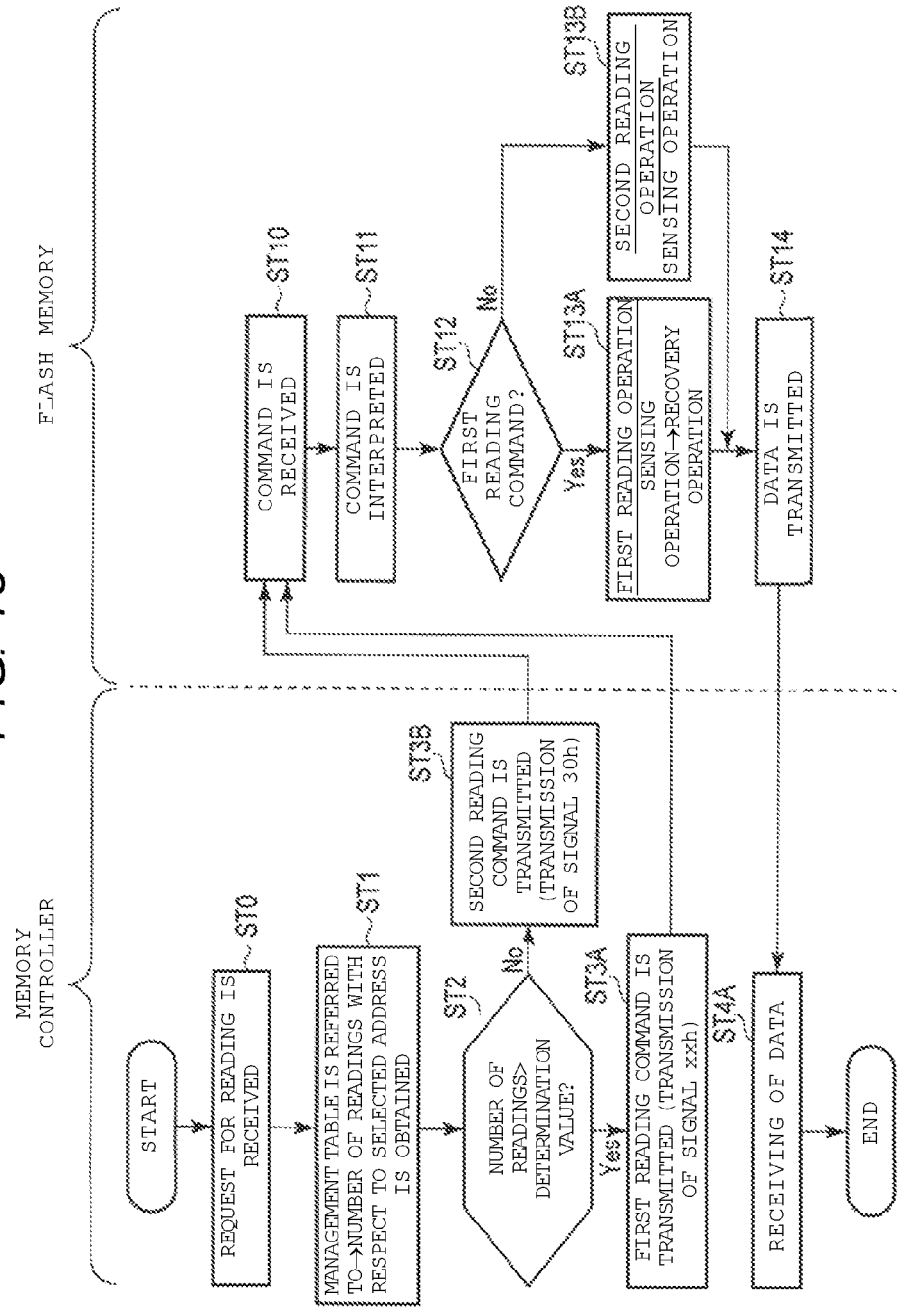
FIG. 13 is a flowchart illustrating an operation example of the memory device according to the embodiment.

As illustrated in a flowchart in FIG. 13, the memory controller 5 receives a reading request from the host device 600 (step ST0).

The memory controller 5 refers to the management table TBL in response to a reading request (step ST1). The CPU 500 obtains the number of readings with respect to an address of an object of the reading request within the management table TBL.

The CPU 500 compares the number of readings with respect to the address with the certain determination value (step ST2).

For example, when the number of readings is equal to or greater than the determination value, the memory controller 5 transmits the first reading command CMD1 (first signal 00h and second signal xxh) to the flash memory 1 together with a selected address ADR so that the recovery operation is executed (step ST3A).

On the other hand, when the number of readings is less than the determination value, the memory controller 5 transmits the second reading command CMD2 (first signal 00h and third signal 30h) to the flash memory 1 together with the selected address ADR so that the recovery operation is not executed (step ST3B).

The flash memory 1 receives the command and the selected address (step ST10).

The sequencer 19 interprets the command (step ST11). The sequencer 19 sets a signal level of the ready/busy signal R/B as an L level.

The sequencer 19 determines whether a received command is a command indicating the reading operation that includes the recovery operation or is a command indicating the reading operation that does not include the recovery operation (step ST12).

For example, the sequencer 19 determines whether a signal received after receiving of the address ADR is the second signal xxh or the third signal 30h.

When the second signal xxh is received, the sequencer 19 controls an operation of each circuit so as to execute one of the recovery operations of the first to fourth embodiments after the sensing operation (step ST13A).

When the third signal 30h is received, the sequencer 19 controls the operation of each circuit so as to execute only the sensing operations without execution of the recovery operation (step ST13B).

Thereafter, the sequencer 19 transmits the read data to the memory controller 5 (step ST14). The sequencer 19 informs the memory controller 5 of completion of the reading operation by setting the signal level of the ready/busy signal R/B as an H level.

The memory controller 5 receives the read data and the ready/busy signal R/B of the H level from the flash memory 1 (step ST4A).

Therefore, the operation of the memory system and the flash memory according to the embodiment is completed.

As described above, the flash memory and the memory system according to the embodiment can suppress prolongation of an entire operation of the memory system due to the recovery operation by selecting presence or absence of the execution of the recovery operation based on the reading command from the memory controller 5.

As described above, in the flash memory and the memory system according to the embodiment, it is possible to improve operation characteristics.

(6) Modification Example

Hereinafter, a modification example of the memory device according to the embodiment will be described.

Figure 14:
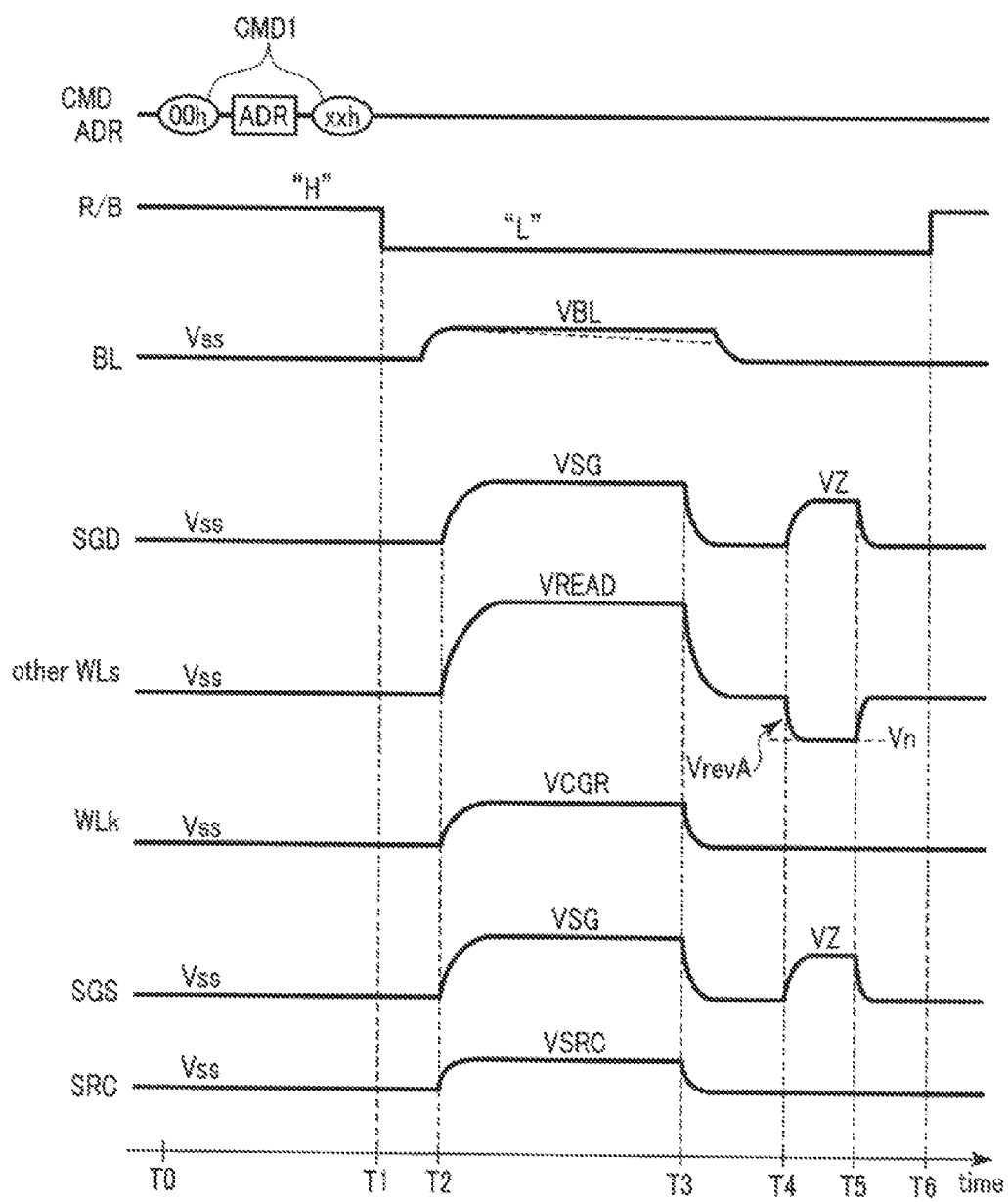
FIG. 14 is a timing chart illustrating a modification of an operation example of the memory device according to the embodiment.

FIG. 14 illustrates the modification example of the memory device according to the embodiment.

As illustrated in a timing chart in FIG. 14, at time T4, a recovery voltage VrcvA of a negative voltage value Vn is applied to an unselected word line otherWLs.

In the modification example, a voltage VZ is applied to the drain-side and source-side select gate lines SGD and SGS during application of a recovery voltage VrcvA. A voltage value of the voltage VZ is equal to or less than a voltage value of a voltage VSG. For example, the select transistors STD and STS are turned on by application of the voltage VZ.

As the flash memory in FIG. 14, the voltage VZ having a positive voltage value may be applied to gate electrodes (select gate lines SGD and SGS) of the select transistors STD and STS during the recovery operation using the recovery voltage of a negative voltage value.

In addition, only one of two select transistors STD and STS may be turned on during the recovery operation.

In the embodiment, the recovery operation executed during the reading operation of the flash memory may be applied to a verify operation in a writing operation of the flash memory. Therefore, the memory device according to the embodiment can suppress reading disturbance during the verify operation. In addition, the recovery operation described in the embodiment may be executed with respect to memory cells connected to the unselected word line of a program operation in the writing operation. In addition, in the storage device or the memory system including the flash memory according to the embodiment, only the recovery operation may be executed in a certain operation cycle.

In a memory cell array including a memory cell array of a three dimensional structure according to the embodiment, one NAND string may include two semiconductor pillars.

In this case, the NAND string includes two semiconductor pillars and a semiconductor portion connecting the two semiconductor pillars.

The semiconductor portion connects a lower end of one semiconductor pillar to a lower end of the other semiconductor pillar.

An upper end of one semiconductor pillar is connected to a bit line. An upper end of the other semiconductor pillar is connected to a source line. A drain-side select transistor is provided on the upper portion side of one semiconductor pillar. A source-side select transistor is provided on the upper portion side of the other semiconductor pillar. The source-side select transistor is positioned at the same height as that of the drain-side select transistor above a substrate.

In each semiconductor pillar, the memory cells are respectively provided on a side surface of semiconductor pillar in a region between the select transistor and the semiconductor portion.

The flash memory used in the memory system according to the embodiment may also be a multi-value flash memory.

An operation of reading of the multi-value flash memory includes a determination voltage as follows.

The determination voltage that is applied to the word line selected for a reading operation of an A level is, for example, in a range of from 0 V to 0.55 V. However, the determination voltage of the A level is not limited to the value and may be any one of ranges of from 0.1 V to 0.24 V, from 0.24 V to 0.31 V, from 0.31 V to 0.4 V, from 0.4 V to 0.5 V, and from 0.5 V to 0.55 V.

The determination voltage that is applied to the word line selected for the reading operation of a B level is, for example, in a range of from 1.5 V to 2.3 V. However, the determination voltage of the B level is not limited to the value and may be any one of ranges of from 1.65 V to 1.8 V, from 1.8 V to 1.95 V, from 1.95 V to 2.1 V, and from 2.1 V to 2.3 V.

The determination voltage that is applied to the word line selected for the reading operation of a C level is, for example, in a range of from 3.0 V to 4.0 V. The determination voltage of the C level is not limited to the value and may be any one of ranges of from 3.0 V to 3.2 V, from 3.2 V to from 3.4 V, from 3.4 V to 3.5 V, from 3.5 V to 3.6 V, and from 3.6 V to 4.0 V.

In addition, a period (tR) of the reading operation may be, for example, one of periods of from 25 μs to 38 μs, from 38 μs to 70 μs, and from 70 μs to 80 μs.

The writing operation of the multi-value flash memory includes the program operation and the verify operation.

In the writing operation of the multi-value flash memory, a voltage initially applied to the word line that is selected during the program operation is, for example, in a range of from 13.7 V to 14.3 V. The voltage is not limited to the value and may be, for example, any one of ranges of from 13.7 V to 14.0 V and from 14.0 V to 14.6 V.

When the program operation is an incremental step pulse program (ISPP) type, a voltage of step-up is, for example, approximately 0.5 V.

A read pass voltage applied to the unselected word line is, for example, a value of a range of from 6.0 V to 7.3 V. However, the read pass voltage is not limited to the value and may be, for example, a value of a range of from 7.3 V to 8.4 V or may be equal to or less than 6.0 V.

The voltage to be applied may be changed according to whether the unselected word line is an odd-numbered word line or an even-numbered word line.

The time (tProg) of the writing operation may be, for example, any one of periods of from 1,700 µs to 1,800 µs, from 1,800 µs to 1,900 µs, and from 1,900 µs to 2,000 µs.

An erasing operation of the multi-value flash memory is formed on an upper portion of the semiconductor substrate and a voltage initially applied to the well region above which the memory cell is arranged is, for example, a value of a range of from 12 V to 13.6 V. The voltage is not limited to the value and may be, for example, any one of ranges of from 13.6 V to 14.8 V, from 14.8 V to 19.0 V, from 19.0 V to 19.8 V and from 19.8 V to 21 V.

The time (tErase) of the erasing operation may be, for example, any one of periods of from 3,000 µs to 4,000 µs, from 4,000 µs to 5,000 µs, and from 5,000 µs to 9,000 µs.

The memory cell has a charge storage layer arranged on the side surface of semiconductor pillar via a tunnel insulating film of from 4 nm to 10 nm. The charge storage layer may be a stacked structure of an insulating film (for example, SiN or SiON, and the like) having a film thickness of from 2 nm to 3 nm and polysilicon of a film thickness of from 3 nm to 8 nm. In addition, the polysilicon may contain metal such as Ru.

The insulating film is provided on the charge storage layer. The insulating film includes, for example, a lower High-k film having a film thickness of from 3 nm to 10 nm, an upper High-k film having a film thickness of from 3 nm to 10 nm, and a silicon oxide film having a film thickness of from 4 nm to 10 nm interposed between the lower and upper High-k films. The High-k film includes a film such as HfO. In addition, the film thickness of the silicon oxide film may be thicker than the film thickness of the High-k film.

A control gate electrode having a film thickness of from 30 nm to 70 nm is provided on the insulating film via a material having a film thickness of 3 nm to 10 nm. This material is a metal oxide film such as TaO and a metal nitride film such as TaN. The control gate electrode may be metal such as tungsten (W).

An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a semiconductor pillar;
   a first memory cell that includes a first memory film between a first word line and a side surface of the semiconductor pillar;
   a second memory cell that includes a second memory film between a second word line and the side surface of the semiconductor pillar; and
   a control circuit configured to carry out first and second operations on the first memory cell and the second memory cell during a reading operation, wherein
   during the first operation, a read voltage is applied to the first word line and a read pass voltage is applied to the second word line, and
   during the second operation following the first operation, a first voltage is applied to the second word line, such that a potential of the second word line is lower than a potential of the semiconductor pillar.

2. The device according to claim 1, wherein
   the read voltage and the read pass voltage have positive voltage values, and
   the first voltage has a negative voltage value.

3. The device according to claim 1, wherein
   during the second operation, a ground voltage is applied as the first voltage to the second word line, and a second voltage having a positive voltage value is applied to the semiconductor pillar.

4. The device according to claim 3, wherein the second voltage is applied through a first end of the semiconductor pillar and a third voltage having a positive voltage value is applied to a second end of the semiconductor pillar.

5. The device according to claim 1, further comprising:
   a third memory cell that includes a third memory film between a third word line and the side surface of the semiconductor pillar, wherein
   during the first operation, the read pass voltage is applied to the third word line, and
   during the second operation, a fourth voltage is applied to the third word line, an absolute value of the voltage value of the first voltage being greater than an absolute value of the voltage value of the fourth voltage.

6. The device according to claim 5, wherein the third memory cell is between the first and second memory cells.

7. The device according to claim 5, wherein the second memory cell is between the first and third memory cells.

8. The device according to claim 5, wherein the third memory cell is a dummy memory cell and the third word line is a dummy word line.

9. The device according to claim 1, further comprising:
   first and second select transistors on the semiconductor pillar, the first and second memory cells disposed on the semiconductor pillar between the first and second select transistors, wherein
   during the first operation, a first positive voltage is applied to the first and second select transistors to turn on the first and second select transistors, and
   during the second operation, a second positive voltage less than the first positive voltage is applied to at least one of the first and second select transistors.

10. A memory system comprising:
    a memory controller; and
    a semiconductor memory device including a semiconductor pillar, a first memory cell that includes a first memory film between a first word line and a side surface of the semiconductor pillar, a second memory cell that includes a second memory film between a second word line and the side surface of the semiconductor pillar, and a control circuit configured to carry out (i) a first operation on the first memory cell and the second memory cell in response to a first read command issued by the memory controller and (ii) a second operation on the first memory cell and the second memory cell in response to a second read command issued by the memory controller, wherein
    during the first operation, a read voltage is applied to the first word line and a read pass voltage is applied to the second word line, and
    during the second operation following the first operation, a first voltage is applied to the second word line, such that a potential of the second word line is lower than a potential of the semiconductor pillar.

11. The system according to claim 10, wherein
the read voltage and the read pass voltage have positive voltage values, and
the first voltage has a negative voltage value.

12. The system according to claim 10, wherein
during the second operation, a ground voltage is applied as the first voltage to the second word line, and a second voltage having a positive voltage value is applied to the semiconductor pillar.

13. The system according to claim 12, wherein the second voltage is applied through a first end of the semiconductor pillar and a third voltage having a positive voltage value is applied to a second end of the semiconductor pillar.

14. The system according to claim 10, further comprising:
a third memory cell that includes a third memory film between a third word line and the side surface of the semiconductor pillar, wherein
during the first operation, the read pass voltage is applied to the third word line, and
during the second operation, a fourth voltage is applied to the third word line, an absolute value of the voltage value of the first voltage being greater than an absolute value of the voltage value of the fourth voltage.

15. The system according to claim 14, wherein the third memory cell is between the first and second memory cells.

16. The system according to claim 14, wherein the second memory cell is between the first and third memory cells.

17. The system according to claim 14, wherein the third memory cell is a dummy memory cell and the third word line is a dummy word line.

18. The system according to claim 10, further comprising:
first and second select transistors on the semiconductor pillar, the first and second memory cells disposed on the semiconductor pillar between the first and second select transistors, wherein
during the first operation, a first positive voltage is applied to the first and second select transistors to turn on the first and second select transistors, and
during the second operation, a second positive voltage less than the first positive voltage is applied to at least one of the first and second select transistors.

19. In a memory system comprising a memory controller and a semiconductor memory device, the semiconductor device including a semiconductor pillar, a first memory cell that includes a first memory film between a first word line and a side surface of the semiconductor pillar, a second memory cell that includes a second memory film between a second word line and the side surface of the semiconductor pillar, and a control circuit configured to carry out (i) a first operation on the first memory cell and the second memory cell in response to a first read command issued by the memory controller and (ii) a second operation on the first memory cell and the second memory cell in response to a second read command issued by the memory controller, a method of issuing either the first read command or the second read command by the memory controller to the semiconductor memory device, wherein
during the first operation, a first positive voltage is applied to the first and second select transistors to turn on the first and second select transistors, and
during the second operation, a second positive voltage less than the first positive voltage is applied to at least one of the first and second select transistors,
said method comprising:
receiving a request to read data at a memory address;
determining a number of reading operations performed at the memory address;
if the determined number of reading operations is less than a threshold value, issuing the first read command to the semiconductor memory device; and
if the determined number of reading operations is greater than a threshold value, issuing the second read command to the semiconductor memory device.

20. The method of claim 19, further comprising:
increasing the number of reading operations performed at the memory address by one; and
storing the increased number of reading operations in a table.

* * * * *